United States Patent [19]
Barrett, Jr. et al.

[11] Patent Number: 5,373,249
[45] Date of Patent: Dec. 13, 1994

[54] COMPLEMENTARY CASCODE PUSH-PULL AMPLIFIER

[75] Inventors: Raymond L. Barrett, Jr., Ft. Lauderdale; Barry W. Herold, Boca Raton; Grazyna A. Pajunen, Delray Beach, all of Fla.

[73] Assignee: Motorola, Inc., Schaumburg, Ill.

[21] Appl. No.: 150,930

[22] Filed: Nov. 10, 1993

[51] Int. Cl.[5] .......................... H03F 3/26; H03F 3/16
[52] U.S. Cl. ..................................... 330/264; 330/267
[58] Field of Search ............... 330/263, 264, 267, 288, 330/296

[56] References Cited

U.S. PATENT DOCUMENTS 5,170,078  12/1992  Hsueh et al. ................... 330/264 X Primary Examiner—Steven Mottola
Attorney, Agent, or Firm—James A. Lamb

[57] ABSTRACT

A complementary cascode push-pull amplifier circuit includes a bias generator, a complementary bias generator, a cascode input stage (416, 417), a cascode output stage (410, 411), a complementary cascode input stage (456, 457), and a complementary cascode output stage (450, 451). The bias generator is responsive to a first input signal (420) and generates a bias control voltage. The complementary bias generator is responsive to a second input (421) and generates a complementary bias control voltage. The cascode output stage (410, 411) and the complementary cascode output stage (450, 451) each have an output coupled to a common output terminal (510) for generating a portion of an output current signal in response to the respective input signals (420, 421) and in response to the bias control voltage and the complementary bias control voltage being generated.

11 Claims, 7 Drawing Sheets

FIG.6    600

COMPLEMENTARY CASCODE PUSH-PULL AMPLIFIER

FIELD OF THE INVENTION

This invention relates in general to electronic amplifier circuits and in particular to push pull transconductance amplifier circuits.

BACKGROUND OF THE INVENTION

In portable battery operated products such as a radio frequency communication device, it is desirable to have the lowest possible overall current drain in order to maximize battery life. Moreover, it is desirable to operate such products at the lowest possible voltage so as to minimize their total power consumption.

Conventional radio frequency communication devices may use one or more application specific integrated circuits to implement functions such as phase lock loops to synthesize frequencies needed for digital logic or radio frequency circuits. To conserve power, a synthesizer or other circuitry implemented in an application specific integrated circuit should generally be operated using as low a voltage as possible. Moreover, to conserve even more power, these circuits may be operated in a power saving mode where one or more of the circuits are switched on during active processing periods (e.g., signal transmission or reception, data storage, retrieval, or presentation) and off during "sleep" or "rest" periods. Operating in this fashion, a portable battery operated product can substantially increase available battery life, thus resulting in more usable "talk time" in a radio frequency communication device such as a cellular telephone or the like.

In the past, low voltage circuitry implemented in application specific integrated circuits typically consisted of bipolar analog or I²L (integrated injection logic) logic circuits, These bipolar circuits experienced problems such as poor high speed operation (I²L operating at 0.25 μA per gate is typically operational to only around 50 KHz), a lack of dynamic range (conventional low bipolar analog circuits have a saturation point of typically 200 mV, yielding a range of less than 600 mV from a one volt supply), and extreme variation of their intrinsic operating characteristics over temperature.

Thus, what is needed is low voltage CMOS (complementary metal oxide semiconductor) process and appropriate circuit topologies that allow a designer to achieve both analog and digital functions using an application specific integrated circuit in a radio frequency communication device. As such, the low voltage CMOS designs would operate at significantly lower power levels than comparable bipolar designs. Moreover, when operated in a power saving mode, the CMOS designs can more effectively conserve power while offering improved circuit performance characteristics.

SUMMARY OF THE INVENTION

Accordingly, in a first aspect of the present invention, a complementary cascode push-pull amplifier circuit includes a bias generator, a complementary bias generator, a cascode input stage, a cascode output stage, a complementary cascode input stage, and a complementary cascode output stage. The bias generator is responsive to a first input signal which is coupled to a bias control input. The bias generator is for generating a bias control voltage at a bias node. The complementary bias generator is responsive to a second input signal which is coupled to a complementary bias control input. The complementary bias generator is for generating a complementary bias control voltage at a complementary bias node.

The cascode input stage has first and second inputs and an output. The first input is coupled to the output and to the bias control input. The first input is also coupled to the first input signal. The cascode output stage has first and second inputs which are coupled to the first and second inputs of the cascode input stage. The cascode output stage also has an output coupled to a common output terminal for generating a first portion of an output current signal in response to the first input signal and the bias control voltage being generated.

The complementary cascode input stage has first and second inputs and an output. The first input is coupled to the output and to the first complementary bias control input. The first input is also coupled to the second input signal. The complementary cascode output stage has first and second inputs which are coupled to the first and second inputs of the complementary cascode input stage. The complementary cascode output stage also has an output coupling to the common output terminal for generating a second portion of the output current signal in response to the second input signal and the complementary bias control voltage being generated.

Accordingly, in a second aspect of the present invention, a selective call radio receiving device is for receiving a radio signal. The selective call radio receiving device includes a receiver for converting and demodulating the selective call signal, a controller, which is coupled to the receiver and is for recovering information within the radio signal, and an alert device, which is coupled to and responsive to the controller, and which is for producing an alert indication in accordance with the recovered information. At least a portion of the receiver and the controller includes a complementary cascode push-pull amplifier circuit.

The complementary cascode push-pull amplifier circuit includes a bias generator, a complementary bias generator, a cascode input stage, a cascode output stage, a complementary cascode input stage, and a complementary cascode output stage. The bias generator is responsive to a first input signal which is coupled to a bias control input. The bias generator is for generating a bias control voltage at a bias node. The complementary bias generator is responsive to a second input signal which is coupled to a complementary bias control input. The complementary bias generator is for generating a complementary bias control voltage at a complementary bias node.

The cascode input stage has first and second inputs and an output. The first input is coupled to the output and to the bias control input. The first input is also coupled to the first input signal. The cascode output stage has first and second inputs which are coupled to the first and second inputs of the cascode input stage. The cascode output stage also has an output coupled to a common output terminal for generating a first portion of an output current signal in response to the first input signal and the bias control voltage being generated.

The complementary cascode input stage has first and second inputs and an output. The first input is coupled to the output and to the first complementary bias control input. The first input is also coupled to the second input signal. The complementary cascode output stage has first and second inputs which are coupled to the first and second inputs of the complementary cascode input stage. The complementary cascode output stage also has an output coupling to the common output terminal for generating a second portion of the output current signal in response to the second input signal and the complementary bias control voltage being generated.

DETAILED DESCRIPTION OF THE INVENTION

Figure 1:
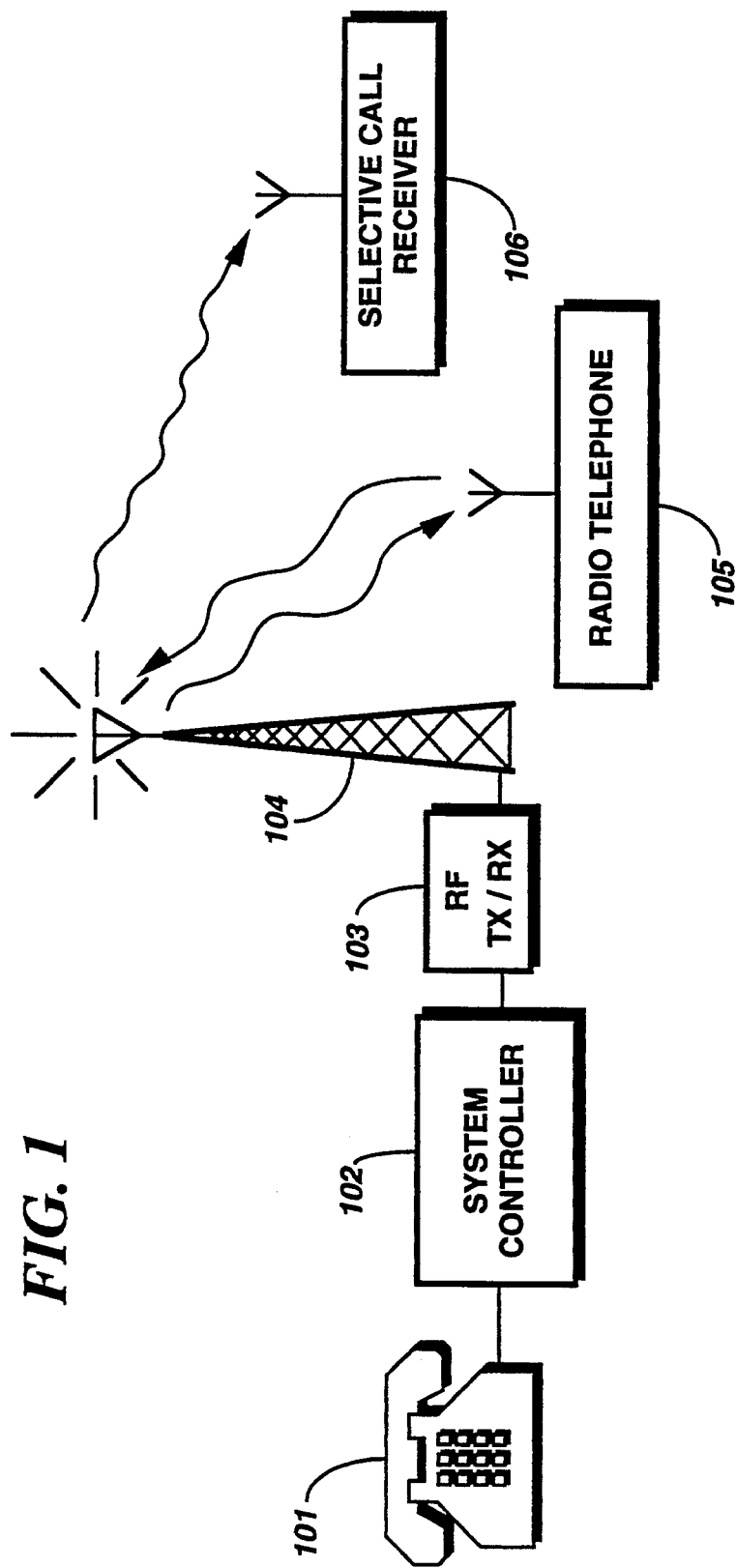
FIG. 1 is a block diagram of a radio frequency communication system suitable for use with the present invention.

Referring to FIG. 1, the preferred embodiment of a radio communication system comprises a telephone 101 connected by a conventional public switched telephone network (PSTN) to a system controller 102 which may oversee operation of a radio frequency transmitter/receiver 103 and encodes and decodes the inbound and outbound addresses into formats that are compatible with the respective land line and cellular radio telephone addressing requirements. The system controller 102 can also function to encode paging messages for transmission by the radio frequency transmitter/receiver 103. Telephony signals are transmitted to and received from a radio telephone 105 by at least one antenna 104 coupled to the radio frequency transmitter/receiver 103. The radio frequency transmitter/receiver 103 may also be used to transmit paging messages to a selective call receiver 106.

It should be noted that the system controller 102 is capable of operating in a distributed transmission control environment that allows mixing cellular, simulcast, master/slave, or any conventional wide and local area coverage scheme. Moreover, as one of ordinary skill in the art would recognize, the telephonic and paging functions may reside in separate system controllers that may operate either independently or in a networked fashion.

Figure 2:
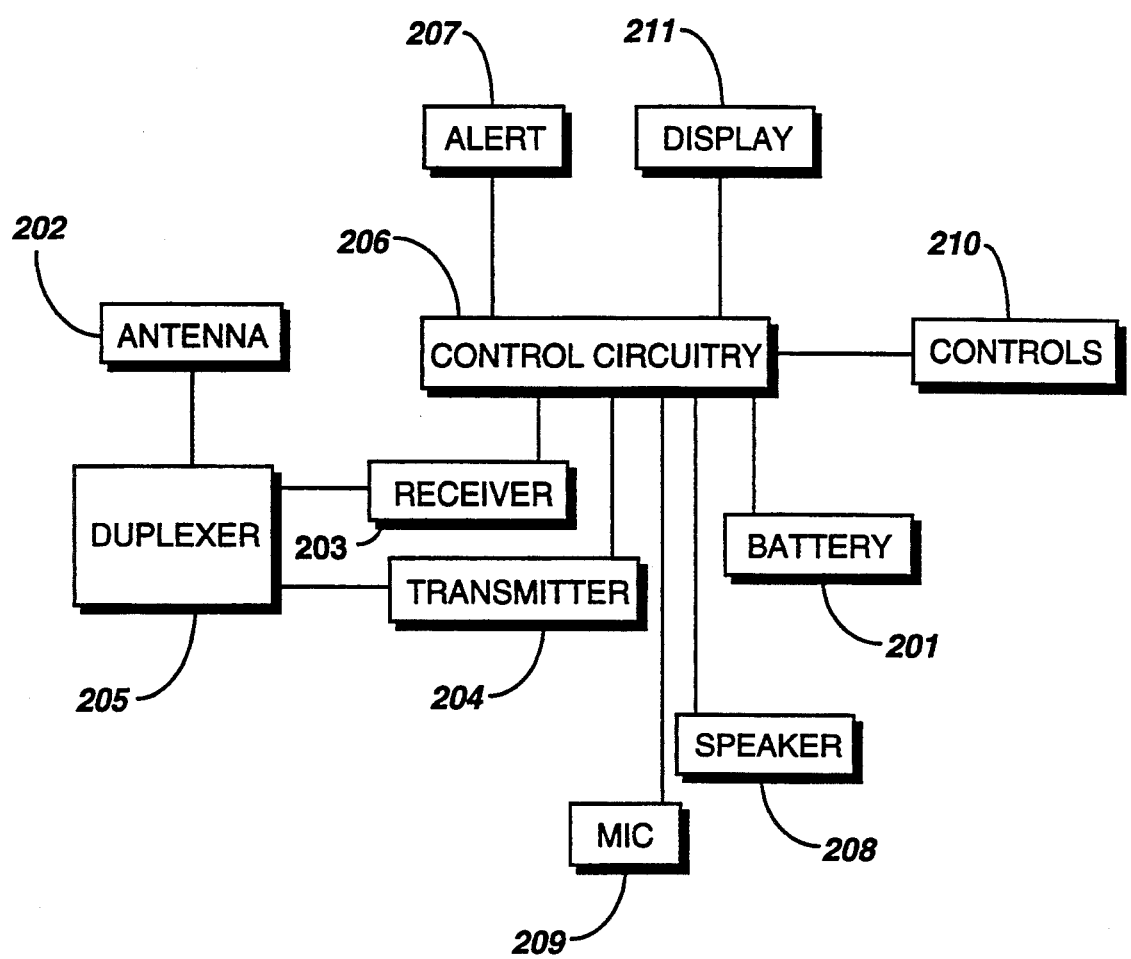
FIG. 2 is a block diagram of a radio telephone depicted in FIG. 1 system suitable for use with the present invention.

Referring to FIG. 2, a block diagram is shown of the battery 201 powered radio telephone 105. A radio frequency signal is received and/or transmitted by an antenna 202. The antenna is coupled to a receiver 203 and a transmitter 204 by a duplexer 205. The received signal is coupled from the receiver 203 to a control circuitry 206 for recovering any information contained within the received signal. This recovered information is then used to activate an alert 207 (a ringer in the case of a cellular radio telephone), and after answering the call, to sustain a telephone connection. When the telephone connection is completed, the user may audibly communicate with another party via a speaker 208 and a microphone 209. The control circuitry 206 routes recovered audio to the speaker 208 which converts electrical energy into acoustical energy thus enabling the user to hear any communications. The microphone 209 is used to convert acoustic energy into electrical energy for use by the control circuitry 206 in modulating the radio frequency carrier produced by the transmitter 204.

The user may initiate a call by selecting a proper control 210 and entering a number of a party to be contacted. When entering and sending, the number may be presented on a display 211 to provide the user with visual feedback confirming the number entered and subsequently sent.

Figure 3:
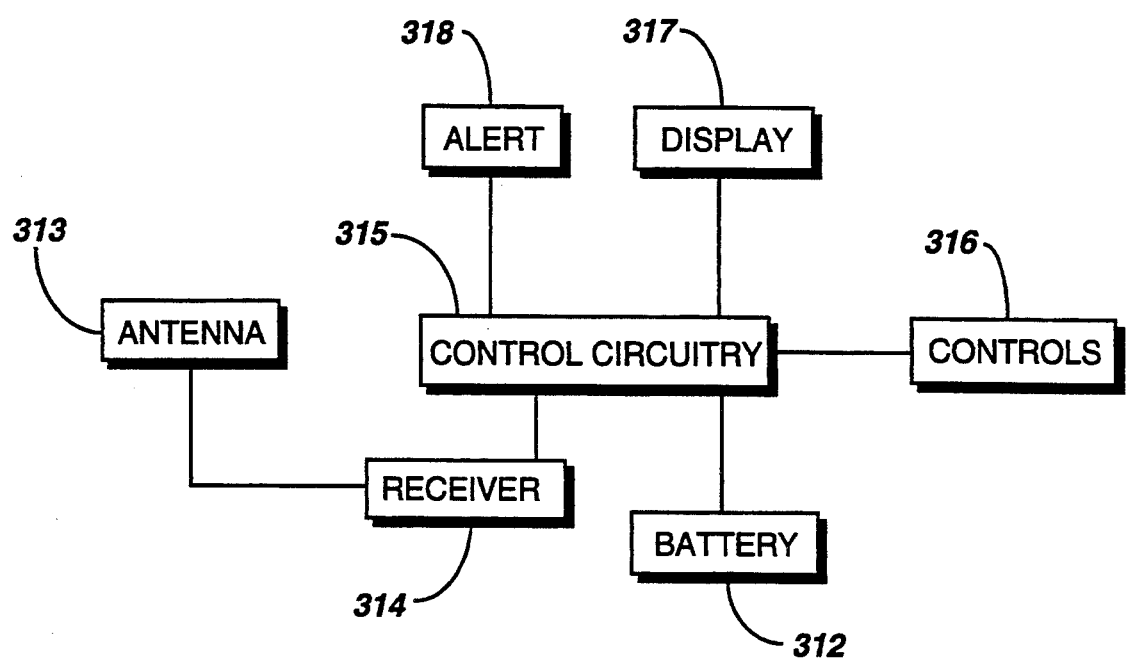
FIG. 3 is a block diagram of a selective call receiver depicted in FIG. 1 system suitable for use with the present invention.

Referring to FIG. 3, a block diagram is shown of the battery 312 powered selective call receiver 106. The selective call receiver operates to receive a signal via an antenna 313. The received signal is routed from the antenna 313 to a receiver 314. The receiver 314 operates to demodulate the received signal using conventional techniques and forwards a demodulated signal to a control circuitry 315, which decodes and recovers information contained within the received signal. In accordance with the recovered information and user controls 316, the selective call receiver may present at least a portion of the information, such as by a display 317, and may signal the user via a sensible alert 318 that a message has been received.

In the preferred embodiments of both the radio telephone and the selective call receiver, the associated control circuitry 206, 315 may comprise a microprocessor or application specific integrated circuit that implements functions such as a signal processor (e.g., a decoder), a conventional signal multiplexer, a voltage regulator that may supply a regulated voltage to other portions of the radio. Alternatively, the associated control circuitry 206, 315 may include features such as A/D, D/A converters, programmable I/O ports, a control bus, environmental sensing circuitry such as for light or temperature conditions, audio power amplifier circuitry, control interface circuitry, a clock or local oscillator frequency synthesizer, and display illumination circuitry. These elements are typically conventionally assembled to provide the marketable features comprising the radio telephone or selective call receiver requested by a customer.

Figure 4:
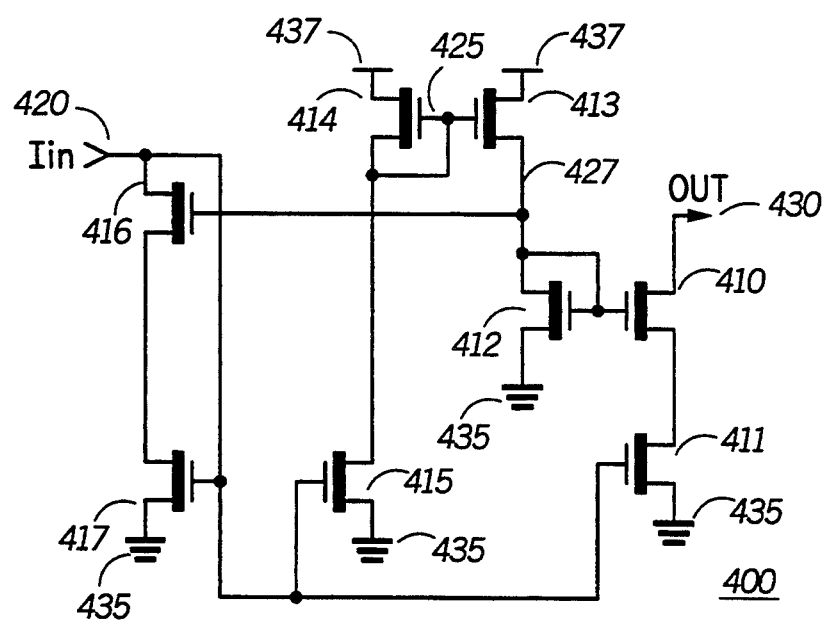
FIG. 4 is an electrical schematic diagram of a cascode current mirror stage suitable for use in accordance with embodiments of the present invention.

Referring to FIG. 4, an electrical schematic diagram of a self biased cascode current mirror stage 400 suitable for use in embodiments of the present invention is shown. The self biased cascode current mirror stage 400 comprises N channel metal oxide semiconductor field effect transistors (MOSFETs) 410, 411, 412, 415, 416 and 417, and P-channel MOSFET transistors 413 and 414 having transistor gains, not necessarily the same. A cascode input transistor pair comprises transistors 416 and 417. A cascode output transistor pair comprises transistors 410 and 411. A self biasing circuit comprising transistors 412, 413, 414, and 415 provides a unity gain self bias voltage at a bias node 427, which node comprises the gates of cascode input and output transistors 410 and 416 coupled to the gate of transistor 412 and the drain of transistor 413. The bias input transistor 415 is responsive to an input signal 420, causing bias input current to flow through transistor 414, which is a bias current mirror input transistor 414 generating a mirror bias signal in a mirror control node 425, which mirror bias signal generates a mirror current in bias current mirror output transistor 413 proportional to the bias input current, in a manner well known to those skilled in the art. The common gates of the bias current mirror transistors 413 and 414, which are coupled together and to the drain of bias input transistor 415, comprise a bias mirror control node 425. The bias current mirror output transistor 413 generates an bias output current in the bias node 427 which passes through transistor 412, a diode connected transistor, in response to the bias input current passing through bias mirror control node 425, generating at the diode transistor output a self bias voltage on the bias node 427. The input signal 420 is coupled to the gates of transistor 417, 415, and 411, and the drain of transistor 416. The source of transistor 416 is coupled to the drain of transistor 417. The source of transistor 410 is coupled to the drain of transistor 411. An output 430 is coupled to the drain of transistor 410. The sources of the bias current mirror transistors 413 and 414 are coupled to a second reference voltage 437 which is more positive than a first reference voltage 435. The sources of transistors 417, 415, and 411 are coupled to the first reference voltage. The self biased cascode current mirror stage 400, which is bootstrap biased, generates a high output impedance current at the output 430, which current is substantially proportional to an input current at the input 420.

Figure 5:
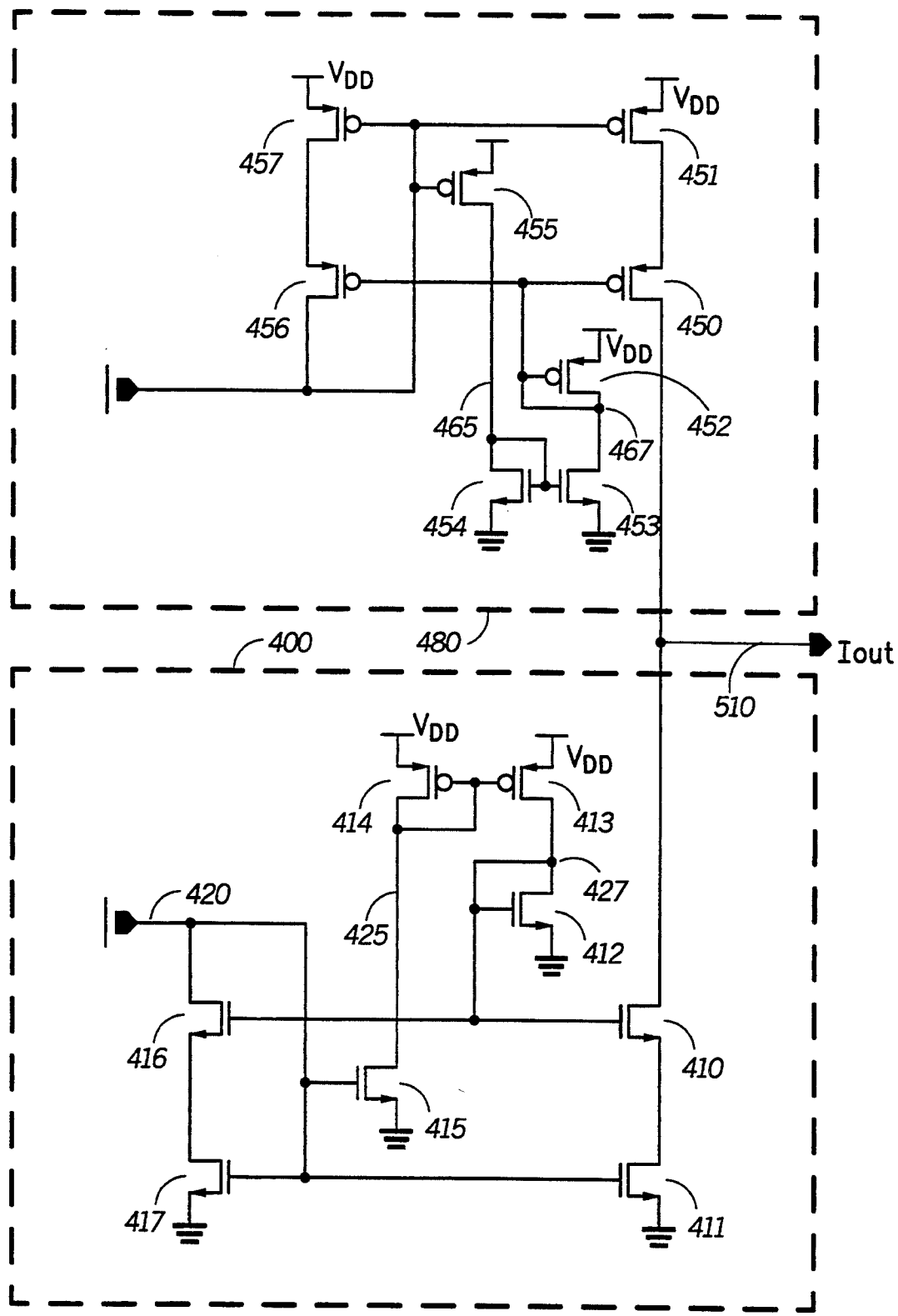
FIG. 5 is a complementary cascode mirror amplifier in accordance with a first alternate embodiment of the present invention.

Referring to FIG. 5, a complementary cascode mirror amplifier 500 for use in the receiver 314 and the receiver 203 of the above described radio communication devices (the selective call receiver 106 and the portable radio telephone) is shown, in accordance with a first alternate embodiment of the present invention. The complementary cascode mirror amplifier 500 is coupled to an output of an IF stage of the receiver for amplifying a frequency error signal, for an automatic frequency control function well known to those skilled in the art, but the amplifier is also used in other applications within in the selective call receiver 106 and the portable radio telephone 105, such as in the controller 206 and 315 for use in a frequency synthesized local oscillator, and in the display 211 and 317. A complementary cascode current mirror stage 480 comprises transistors 450, 451, 452, 453, 454, 455, 456, and 457 having transistor gains not necessarily the same. As can be seen from inspection of the figure, the intercoupling of P-channel MOSFET transistors 450, 451, 452, and 455, and N-channel MOSFET transistors 453, and 454 is identical to the respective intercoupling of N-channel MOSFET transistors 410, 411, 412, 415, 416 and 417, and P-channel MOSFET transistors 413 and 414 in FIG. 4, for the reversal of the first and second reference voltages 435 and 437. A bias mirror control node 465 and a bias node 467 are nodes corresponding to the bias mirror control node 425 and the bias node 427 in the self biased cascode current mirror stage 400. The complementary self biased cascode mirror stage 480 is coupled to an input signal 421. The complementary self biased cascode mirror stage 480 operates in the same manner as the self biased cascode mirror stage 400. The self biased cascode mirror stage 400 and the complementary self biased cascode mirror stage 480 are coupled at their outputs to form a common output 510. Together, the cascode current mirror stage 400 and complementary cascode current mirror stage 480 form a complementary push-pull cascode mirror amplifier 500 in which current is sourced by transistor 450 to provide a push portion of the output 510 in proportion to the current of input signal 421, and current is sunk by transistor 410 provide a pull portion of the output 510 in proportion to current of input signal 420. When operated in Class B operation, one of the self biased cascode current mirror stages 400 or 480 conducts current to the output 510, while the other is inactive.

Figure 6:
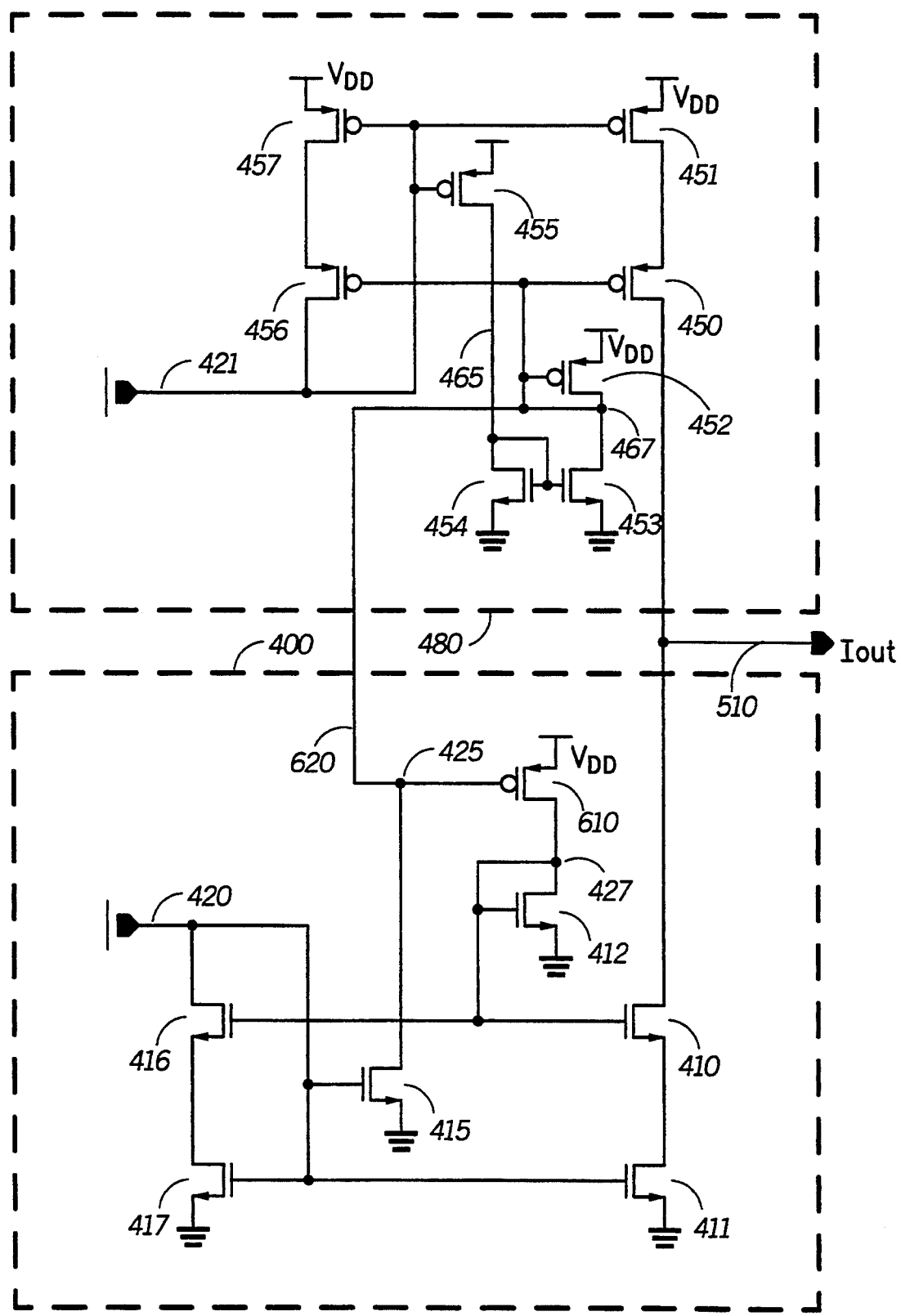
FIG. 6 is a complementary cascode mirror amplifier in accordance with a second alternate embodiment of the present invention.

Referring now to FIG. 6, a complementary push pull cascode mirror amplifier 600 for use in the receiver 314 and the receiver 203 of the above described communication devices (the selective call receiver 106 and the portable radio telephone) is shown, in accordance with a second alternative embodiment of the present invention. This second alternate embodiment of the present invention is used for the same applications and will perform better than the complementary push pull cascode mirror amplifier 500, as will be described below. The complementary push pull cascode mirror amplifier 600 is coupled to an output of an IF stage of the receiver for amplifying a frequency error signal, for an automatic frequency control function well known to those skilled in the art, but the amplifier is equally usable in a wide variety of functions such as frequency synthesized local oscillator. It can be seen by inspection that the complementary push pull cascode mirror amplifier 600 is very similar to the complementary push pull cascode mirror amplifier 500, differing as follows: the transistor 414 is absent, the transistor 413 has been replaced by a transistor 610, and the bias mirror control node 425 has been connected to the bias node 467, forming a common bias node 620. The transistor 610 differs from the transistor 413 in that the gain is altered to substantially match the gain of transistor 452, to provide proper current mirroring operation.

In class B operation, the unique self bias circuit comprising transistors 412, 415, 610, 452, 453, 454, and 455 functions as a unity gain amplifier for push and pull signals, but it also acts to share the bias signals, applying any developed cascode biases to both stages 400 and 480 in common. The net effect is the conversion of the bootstrapped self bias from a differential-mode signal, as applied to the common gate transistors 410 and 450 into a common mode signal. Due to the construction of the self biased cascode current mirror stages 400 and 480, common mode signals cancel and only the differential mode signals are presented to the output 510. Since the differential mode signals are still controlled by the common source transistors 411 and 451 in the input and output cascode transistor pairs, and further since only one of these transistors 411 and 451 is conducting when the circuit is used in class B operation, the common mode signals coupled to the output by the gate to drain capacitances of transistors 410 and 450 cancel, raising the output impedance as if there were no capacitive loads present. This raising of the output impedance is due to the elimination of the Miller effect, well known to those skilled in the art, which is present in the alternative embodiment which was described in reference to FIG. 5.

It will be appreciated in another alternative embodiment the common bias node 620 of the complementary push pull cascode mirror amplifier 600 can be formed from connection of the bias mirror control node 465 of the complementary cascode current mirror stage 480 to the bias node 427 of the cascode current mirror stage 400, from the elimination of transistor 454 instead of transistor 414, and substitution of a transistor with modified gain for transistor 453. This approach, however is not quite as good as the second alternative embodiment described above, because technologies typically used to implement N-channel transistors such as 452 result in them operating faster than P-channel transistors such as 412, in response to a signal.

Figure 7:
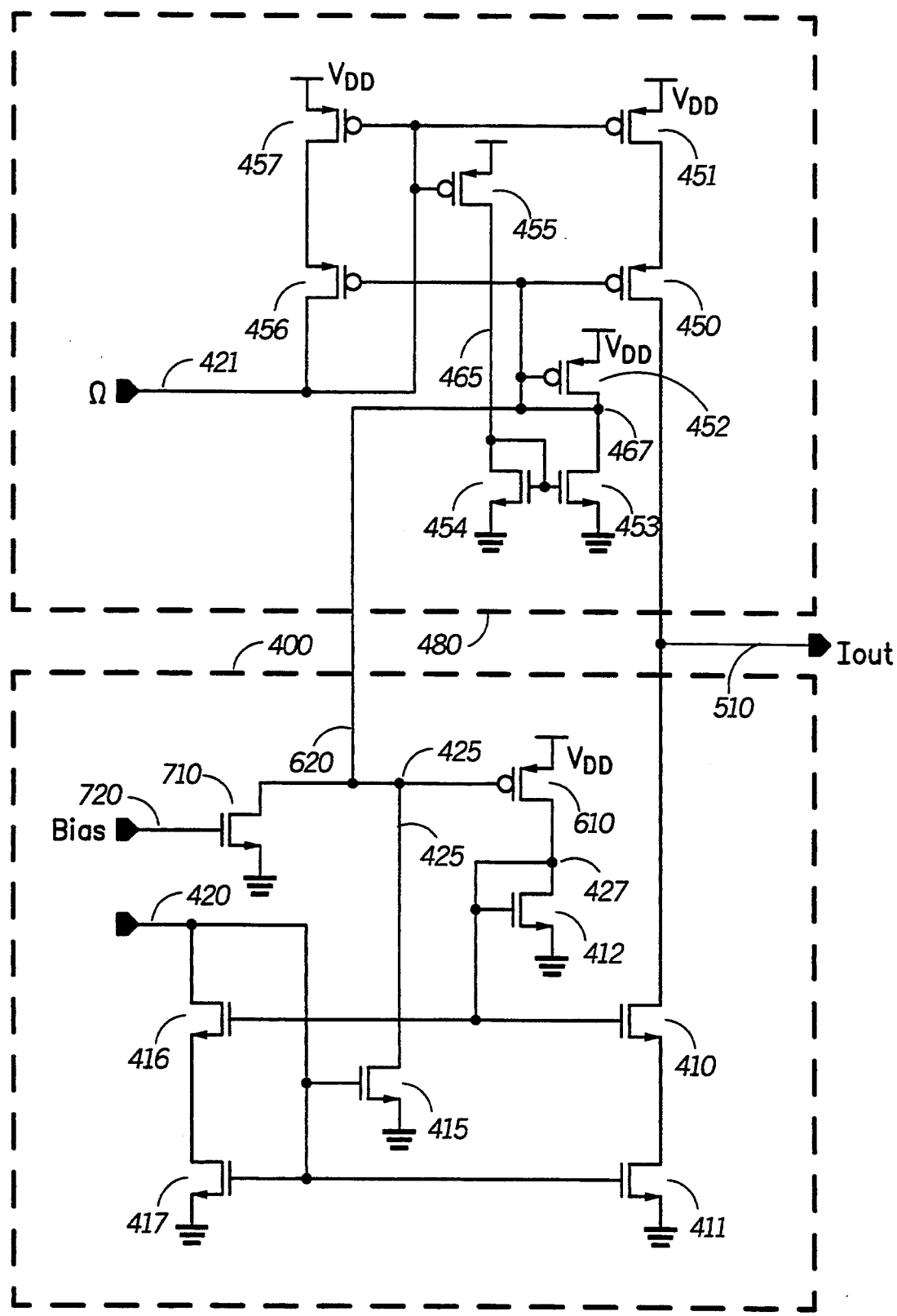
FIG. 7 is a complementary cascode mirror amplifier in accordance with a preferred embodiment of the present invention.

Referring to FIG. 7, a complementary push pull cascode mirror amplifier 700 for use in the receiver 314 and the receiver 203 of the above described communication devices (the selective call receiver 106 and the portable radio telephone) is shown, in accordance with a preferred embodiment of the present invention. This preferred embodiment of the present invention is used for the same applications and will perform better than the complementary push pull cascode mirror amplifier 600, as will be described below. The complementary push pull cascode mirror amplifier 700 is coupled to an output of an IF stage of the receiver for amplifying a frequency error signal, for an automatic frequency control function well known to those skilled in the art, but the amplifier is equally usable in a wide variety of functions such as frequency synthesized local oscillator. It can be seen by inspection that the complementary push pull cascode mirror amplifier 700 is very similar to the complementary push pull cascode mirror amplifier 600, differing as follows: a trickle bias transistor 710 is added to the circuit. The gate of the trickle bias transistor 710 is coupled to a trickle bias signal 720, the drain is coupled to the common bias node 620, and the source is coupled to the first reference voltage. The trickle bias transistor 710 provides a small (trickle) bias current to the common bias node 620 when an appropriate bias voltage, generated in a manner well known those skilled in the art, is coupled to the bias input 720. The trickle bias current prevents the self bias voltages generated at nodes 427 and 620 from becoming too close to the respective first and second reference voltages, which if not prevented, results in operation of the cascode stages at subthreshold levels. Since the trickle bias current is a common mode signal in the output 510, and since the trickle bias current is applied only to the common gate transistors 410 and 450 in each cascode output pair, the trickle bias current does not alter the output current at output 510, but the trickle bias current causes more rapid transition of operation of the complementary push pull cascode mirror amplifier 700 from a low output current to a high output current by maintaining the charge on the common gate transistors 410 and 450.

Thus, it can be seen that the unique coupling of the bias node 467 of the complementary cascode current mirror stage 480 to the bias mirror control node 425 of the cascode current mirror stage 400 results in an complementary cascode mirror amplifier 600 having significantly higher output impedance than alternative embodiments of complementary cascode mirror amplifiers, and the inclusion of the trickle bias provides faster response.

We claim:

1. A complementary cascode push-pull amplifier circuit comprising:
    a bias generator, responsive to a first input signal (420) coupled to a bias control input, for generating a bias control voltage at a bias node (427);
    a complementary bias generator, responsive to a second input signal (421) coupled to a complementary bias control input, for generating a complementary bias control voltage at a complementary bias node (467);
    a cascode input stage (416, 417) having first and second inputs and an output, said first input being coupled to said output and to said bias control input, and further coupled to said first input signal (420);
    a cascode output stage (410, 411), having first and second inputs coupled to said first and second inputs of said cascode input stage, and further having an output coupling to a common output terminal (510) for generating a first portion of an output current signal in response to said first input signal (420) and said bias control voltage being generated;
    a complementary cascode input stage (456, 457) having first and second inputs and an output, said first input being coupled to said output and to said first complementary bias control input, and further coupled to said second input signal (421); and
    a complementary cascode output stage (450, 451) having first and second inputs being coupled to said first and second inputs of said complementary cascode input stage, and further having an output coupling to the common output terminal (510) for generating a second portion of the output current signal in response to said second input signal (421) and said complementary bias control voltage being generated.

2. The complementary cascode push-pull amplifier circuit according to claim 1, wherein said cascode input stage (416, 417) comprises first and second field effect transistors of a first type coupled in a cascode configuration, and wherein said cascode output stage (410, 411) also comprises first and second field effect transistors of a first type coupled in a cascode configuration.

3. The complementary cascode push-pull amplifier circuit according to claim 1, wherein said complementary cascode input stage (416, 417) comprises first and second field effect transistors of a second type coupled in a cascode configuration, and wherein said complementary cascode output stage (410, 411) also comprises first and second field effect transistors of a second type coupled in a cascode configuration.

4. The complementary cascode push-pull amplifier circuit according to claim 1, wherein said bias generator comprises:
    a bias input amplifier (415), of a first type, having a control input coupled to the first input signal (420), for generating a bias input current proportional to the voltage of the first input signal (420) at a drain terminal,
    a bias current mirror output amplifier (414, 413), of a second type, having a control input coupled to the drain terminal of said bias input amplifier (415), for generating, at a drain terminal of said bias current mirror output amplifier (414, 413), a bias output current proportional to the bias input current, and
    a diode connected amplifier (412), of a first type, having said bias node (427) comprising a coupling of a control input and a drain terminal of said diode connected amplifier (412), further coupled to the drain terminal of said bias current mirror output amplifier (414, 413), for generating the self bias voltage in response to the bias output current; and
wherein said complementary bias generator comprises:
    a complementary bias input amplifier (455), of a second type, having a control input coupled to the second input signal (421), for generating a complementary bias input current proportional to the voltage of the second input signal (421) at a drain terminal, a complementary bias current mirror output amplifier (454, 453), of a first type, having a control input coupled to the drain terminal of said complementary bias input amplifier (455), for generating, at a drain terminal of said complementary bias current mirror output amplifier (454, 453), a complementary bias output current proportional to the complementary bias input current, and a complementary diode connected amplifier (452), of a second type, having said complementary bias node (467) comprising a coupling of a control input and a drain terminal of said complementary diode connected amplifier (452), further coupled to the drain terminal of said complementary bias current mirror output amplifier (454, 453), for generating the complementary self bias voltage in response to the complementary bias output current.

5. The complementary cascode push-pull amplifier circuit according to claim 1, wherein said complementary bias node (467) is further coupled to said bias generator at a common bias node (620), and wherein common mode signals present within said first input signal (420) and said second input signal (421) are effectively canceled within said output current signal generated at said common output terminal (510).

6. The complementary cascode push-pull amplifier circuit according to claim 5, further comprising a trickle bias generator (710) coupled to said common bias node (620) for generating a trickle bias current.

7. The complementary cascode push-pull amplifier circuit according to claim 5, wherein said bias generator comprises:

a bias input amplifier (415), of a first type, having a control input coupled to the first input signal (420), for generating a bias input current proportional to the voltage of the first input signal (420) at a drain terminal, a bias current mirror output amplifier (610), of a second type, having a control input coupled to the drain terminal of said bias input amplifier (415) and to said common bias node (620), for generating, at a drain terminal of said bias current mirror output amplifier (610), a bias output current proportional to the bias input current in said common bias node (620), and a diode connected amplifier (412), of a first type, having a bias node (427) comprising a coupling of a control input and a drain terminal of said diode connected amplifier (412), further coupled to the drain terminal of said bias current mirror output amplifier (610), for generating the self bias voltage in response to the bias output current; and wherein said complementary bias generator comprises:

a complementary bias input amplifier (455), of a second type, having a control input coupled to the second input signal (421), for generating a complementary bias input current proportional to the voltage of the second input signal (421) at a drain terminal, a complementary bias current mirror output amplifier (454, 453), of a first type, having a control input coupled to the drain terminal of said complementary bias input amplifier (455), for generating, at a drain terminal of said complementary bias current mirror output amplifier (454, 453), a complementary bias output current proportional to the complementary bias input current in said common node (620), and a complementary diode connected amplifier (452), of a second type, having a complementary bias node (467) comprising a coupling of a control input and a drain terminal of said complementary diode connected amplifier (452), further coupled to the drain terminal of said complementary bias current mirror output amplifier (454, 453), and further coupled to said common bias node (620) for generating the complementary self bias voltage in response to the complementary bias output current.

8. The complementary cascode push-pull amplifier circuit according to claim 1, wherein said bias node (427) is further coupled to said complementary bias generator at a common bias node (620), and wherein common mode signals present within said first input signal (420) and said second input signal (421) are effectively canceled within said output current signal generated at said common output terminal (510).

9. The complementary cascode push-pull amplifier circuit according to claim 8, further comprising a trickle bias generator (710) coupled to said common bias node (620) for generating a trickle bias current.

10. The complementary cascode push-pull amplifier circuit according to claim 8, wherein said bias generator comprises:

a bias input amplifier (415), of a first type, having a control input coupled to the first input signal (420), for generating a bias input current proportional to the voltage of the first input signal (420) at a drain terminal, a bias current mirror output amplifier (414, 413), of a second type, having a control input coupled to the drain terminal of said bias input amplifier (415), for generating, at a drain terminal of said bias current mirror output amplifier (414, 413), a bias output current proportional to the bias input current in said common node, and a diode connected amplifier (412), of a first type, having a bias node (427) comprising a coupling of a control input and a drain terminal of said diode connected amplifier (412), further coupled to the drain terminal of said bias current mirror output amplifier (414, 413), and further coupled to said common bias node (620) for generating the complementary self bias voltage in response to the complementary bias output current; and wherein said complementary bias generator comprises:

a complementary bias input amplifier (455), of a second type, having a control input coupled to the second input signal (421), for generating a complementary bias input current proportional to the voltage of the second input signal (421) at a drain terminal, a complementary bias current mirror output amplifier (610), of a first type, having a control input coupled to the drain terminal of said complementary bias input amplifier (455) and to said common bias node, for generating, at a drain terminal of said complementary bias current mirror output amplifier (610), a complementary bias output current proportional to the bias input current in said common bias node (620), and a complementary diode connected amplifier (452), of a second type, having a complementary bias node (467) comprising a coupling of a control input and a drain terminal of said complementary diode connected amplifier (452), further coupled to the drain terminal of said complementary bias current mirror output amplifier (610), for generating the complementary self bias voltage in response to the complementary bias output current.

11. A selective call radio receiving device, for receiving a radio signal, the selective call radio receiving device comprising:

a receiver for converting and demodulating the selective call signal;

a controller, coupled to the receiver, for recovering information within the radio signal; and an alert device, coupled to and responsive to said controller, for producing an alert indication in accordance with the recovered information; and wherein at least a portion of said receiver and said controller includes a complementary cascode push-pull amplifier circuit comprising:

a bias generator, responsive to a first input signal (420) coupled to a bias control input, for generating a bias control voltage at a bias node (427);

a complementary bias generator, responsive to a second input signal (421) coupled to a complementary bias control input, for generating a complementary bias control voltage at a complementary bias node (467);

a cascode input stage (416, 417) having first and second inputs and an output, said first input being coupled to said output and to said bias control input, and further coupled to said first input signal (420);

a cascode output stage (410, 411), having first and second inputs coupled to said first and second inputs of said cascode input stage, and further having an output coupling to a common output terminal (510) for generating a first portion of an output current signal in response to said first input signal (420) and said bias control voltage being generated;

a complementary cascode input stage (456, 457) having first and second inputs and an output, said first input being coupled to said output and to said first complementary bias control input, and further coupled to said second input signal (421); and a complementary cascode output stage (450, 451) having first and second inputs being coupled to said first and second inputs of said complementary cascode input stage, and further having an output coupling to the common output terminal (510) for generating a second portion of the output current signal in response to said second input signal (421) and said complementary bias control voltage being generated.

* * * * *